US009728460B2

(12) United States Patent
Maeda

(10) Patent No.: US 9,728,460 B2
(45) Date of Patent: Aug. 8, 2017

(54) METHOD OF MANUFACTURING SEMICONDUCTOR DEVICE

(71) Applicant: Renesas Electronics Corporation, Tokyo (JP)

(72) Inventor: Shinichi Maeda, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/278,332

(22) Filed: Sep. 28, 2016

(65) Prior Publication Data

US 2017/0125295 A1    May 4, 2017

(30) Foreign Application Priority Data

Oct. 30, 2015  (JP) .................................. 2015-215001

(51) Int. Cl.
| | |
|---|---|
| H01L 21/331 | (2006.01) |
| H01L 21/8222 | (2006.01) |
| H01L 27/082 | (2006.01) |
| H01L 21/324 | (2006.01) |

(52) U.S. Cl.
CPC ........ *H01L 21/8222* (2013.01); *H01L 21/324* (2013.01); *H01L 27/082* (2013.01)

(58) Field of Classification Search
CPC .......................... H01L 21/8222; H01L 21/324
USPC .......................................................... 438/378
See application file for complete search history.

(56) References Cited

FOREIGN PATENT DOCUMENTS

JP          05-67739 A       3/1993

*Primary Examiner* — Anthony Ho
(74) *Attorney, Agent, or Firm* — McDermott Will & Emery LLP

(57) ABSTRACT

It is prevented that when a predetermined number of semiconductor chips having transistors are manufactured from one semiconductor wafer, manufacturing cost of a semiconductor device is increased due to excess semiconductor chips manufactured from the semiconductor wafer. A first bipolar transistor including a first emitter region having a first area is formed in a first chip formation region in an exposure region that can be exposed by one exposure step, and a second bipolar transistor including a second emitter region having a second area different from the first area is formed in a second chip formation region in the exposure region.

11 Claims, 11 Drawing Sheets

METHOD OF MANUFACTURING SEMICONDUCTOR DEVICE

CROSS-REFERENCE TO RELATED APPLICATIONS

The disclosure of Japanese Patent Application No. 2015-215001 filed on Oct. 30, 2015 including the specification, drawings and abstract is incorporated herein by reference in its entirety.

BACKGROUND

The present invention relates to a method of manufacturing a semiconductor device. For example, the invention is usable for manufacturing a semiconductor device having a bipolar transistor.

Each of transistors to be used for current amplification has an amplification factor ($h_{FE}$) having a value corresponding to a specification of the transistor. As a method of suppressing variations in amplification factor $h_{FE}$ characteristics between a plurality of transistors formed from one semiconductor wafer in a manufacturing process of a semiconductor device, it is known that a vertical furnace is used instead of a horizontal furnace in a heat treatment step for diffusing an impurity introduced into a semiconductor substrate.

Japanese Unexamined Patent Application Publication No. Hei 5(1993)-67739 describes that part of a surface of a semiconductor wafer is covered with a mask, and emitter regions of some transistors are modified crystallographically or metallurgically, thereby the amplification factor $h_{FE}$ of each of such transistors is varied.

SUMMARY

A large number of semiconductor chips each including a transistor having a predetermined $h_{FE}$ characteristic can be produced from one semiconductor wafer. If a small number of semiconductor chips are necessary among the semiconductor chips produced in such a way, the remaining semiconductor chips, which are also produced from the semiconductor wafer, are not necessary.

Recently, the number of semiconductor chips producible from one semiconductor wafer increases with an increase in diameter of a semiconductor wafer. In addition, improvement in heating technique improves uniformity of $h_{FE}$ characteristics between the transistors of the semiconductor chips produced from one semiconductor wafer. Hence, when a small number of semiconductor chips each including a transistor having predetermined $h_{FE}$ characteristics are desired to be produced, and if a large number of such semiconductor chips are manufactured from one semiconductor wafer, unnecessary semiconductor chips are excessively supplied, which increases manufacturing cost of a semiconductor device.

The technique of crystallographically or metallurgically modifying the emitter region as described in Japanese Unexamined Patent Application Publication No. Hei 5(1993)-67739 is technically difficult to accurately control the $h_{FE}$ characteristics and therefore difficult to produce a transistor having desired characteristics.

Other issues and novel features will be clarified from the description of this specification and the accompanying drawings.

A typical embodiment disclosed in this application is briefly summarized as follows.

A method of manufacturing a semiconductor device as one embodiment is to produce various semiconductor chips including transistors, which have emitter regions having different areas, from one semiconductor wafer.

According to the embodiment, manufacturing cost of the semiconductor device can be decreased. In particular, unnecessary chips can be prevented from being produced from the semiconductor wafer.

DETAILED DESCRIPTION

Hereinafter, one embodiment of the invention will be described in detail with reference to the accompanying drawings. In all drawings for explaining the following embodiment, components having the same function are designated by the same numeral, and duplicated description is omitted. In the following embodiment, the same or similar portion is not repeatedly described in principle except for a particularly required case.

This embodiment is embodied as a semiconductor device including a bipolar transistor. Although this embodiment is described on an npn bipolar transistor, the semiconductor device of this embodiment can be applied to a pnp bipolar transistor having an opposite conductivity type, and thus effects similar to those for the npn bipolar transistor can be provided for the pnp bipolar transistor.

Manufacturing Method of Semiconductor Device

A method of manufacturing a semiconductor device of this embodiment is now described with reference to FIGS. 1 to 15.

FIGS. 1, 2, 5, 8, 14, and 15 are each a plan view of the semiconductor device of this embodiment during a manufacturing process of the semiconductor device. FIGS. 3, 4, 6, 7, 9, 11, 12, and 13 each include sectional views of the semiconductor device of this embodiment during the manufacturing process. FIG. 10 is a sectional view of a vertical furnace used in the manufacturing process of the semiconductor device of this embodiment.

Figure 2:
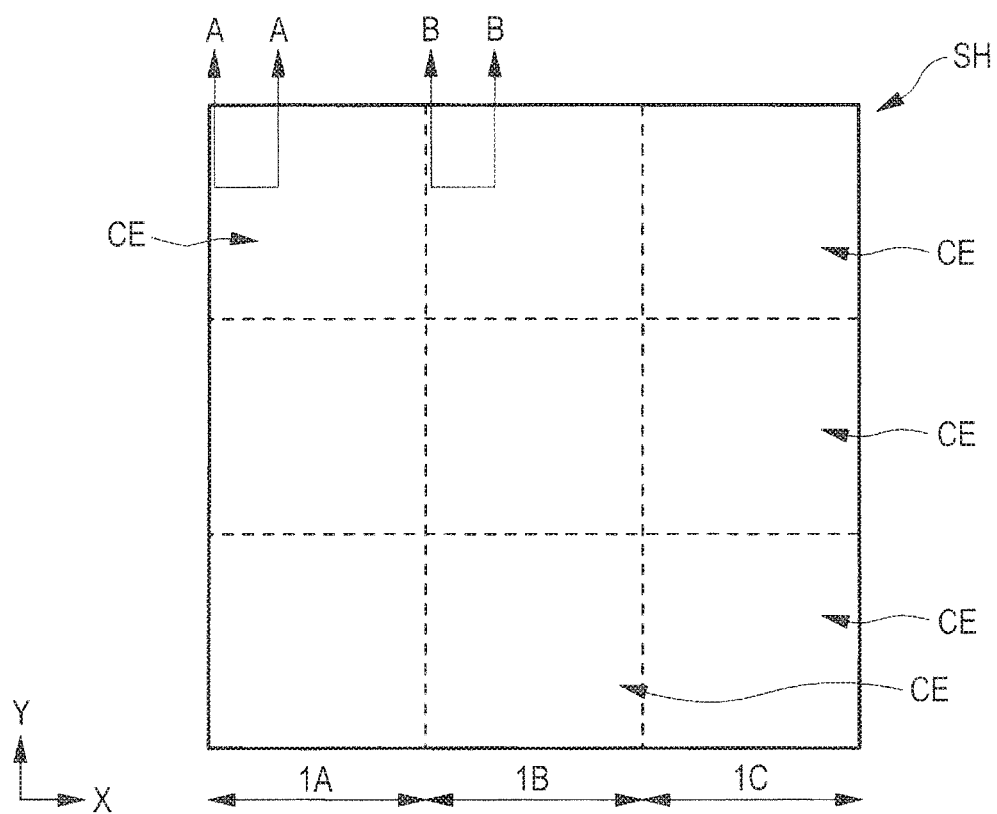
FIG. 2 is a plan view of the semiconductor device as the embodiment during the manufacturing process.
Figure 5:
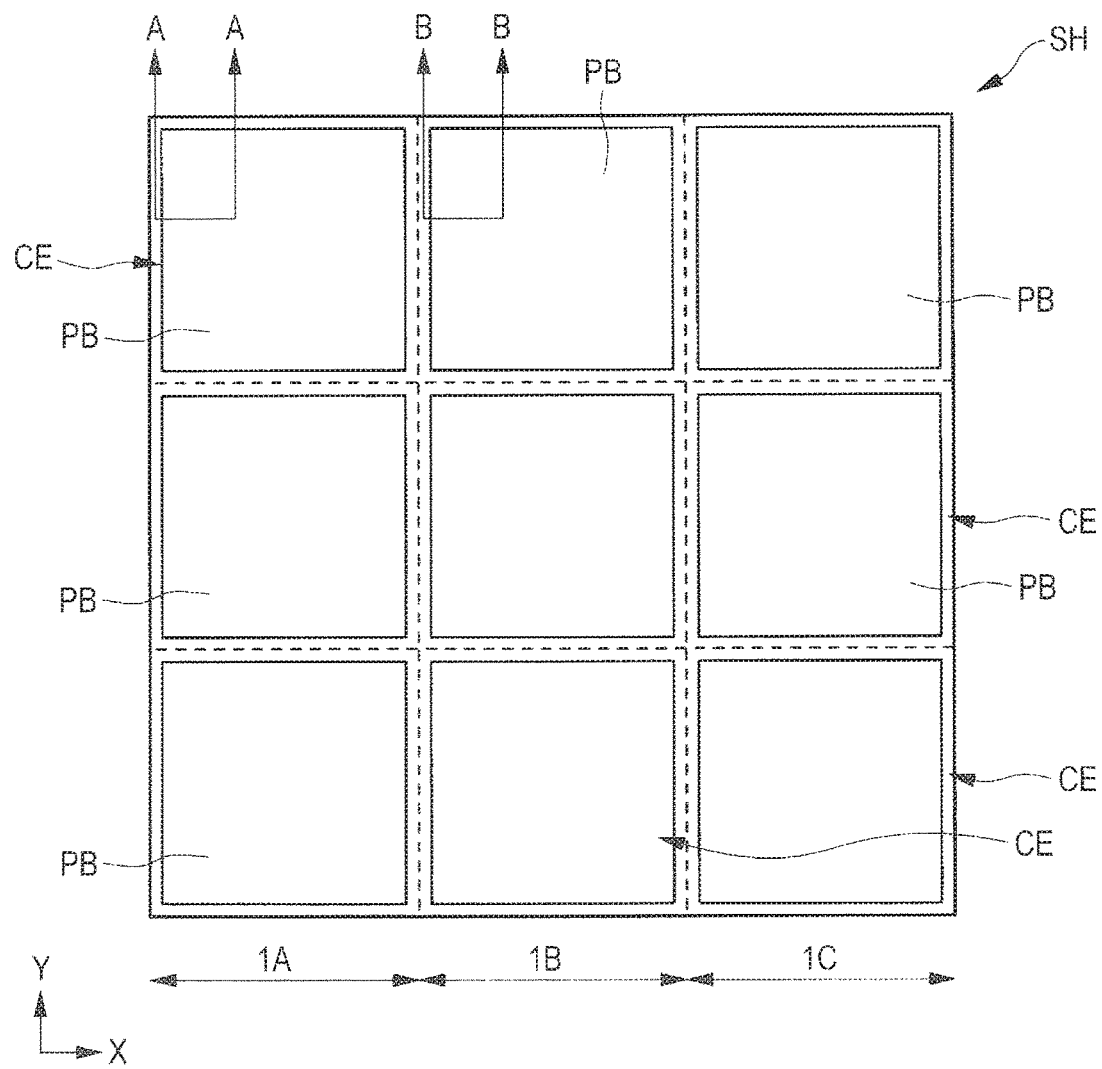
FIG. 5 is a plan view of the semiconductor device during the manufacturing process following FIG. 4.
Figure 6:
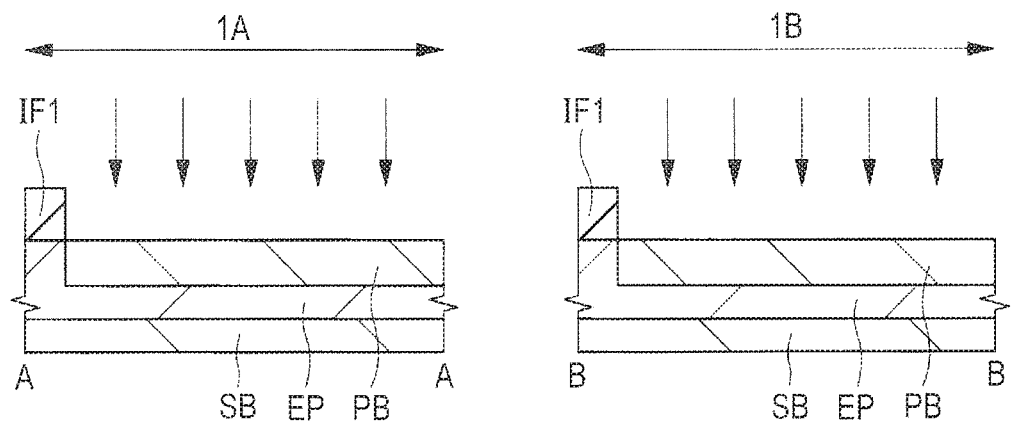
FIG. 6 includes sectional views of the semiconductor device during the manufacturing process following FIG. 4.
Figure 8:
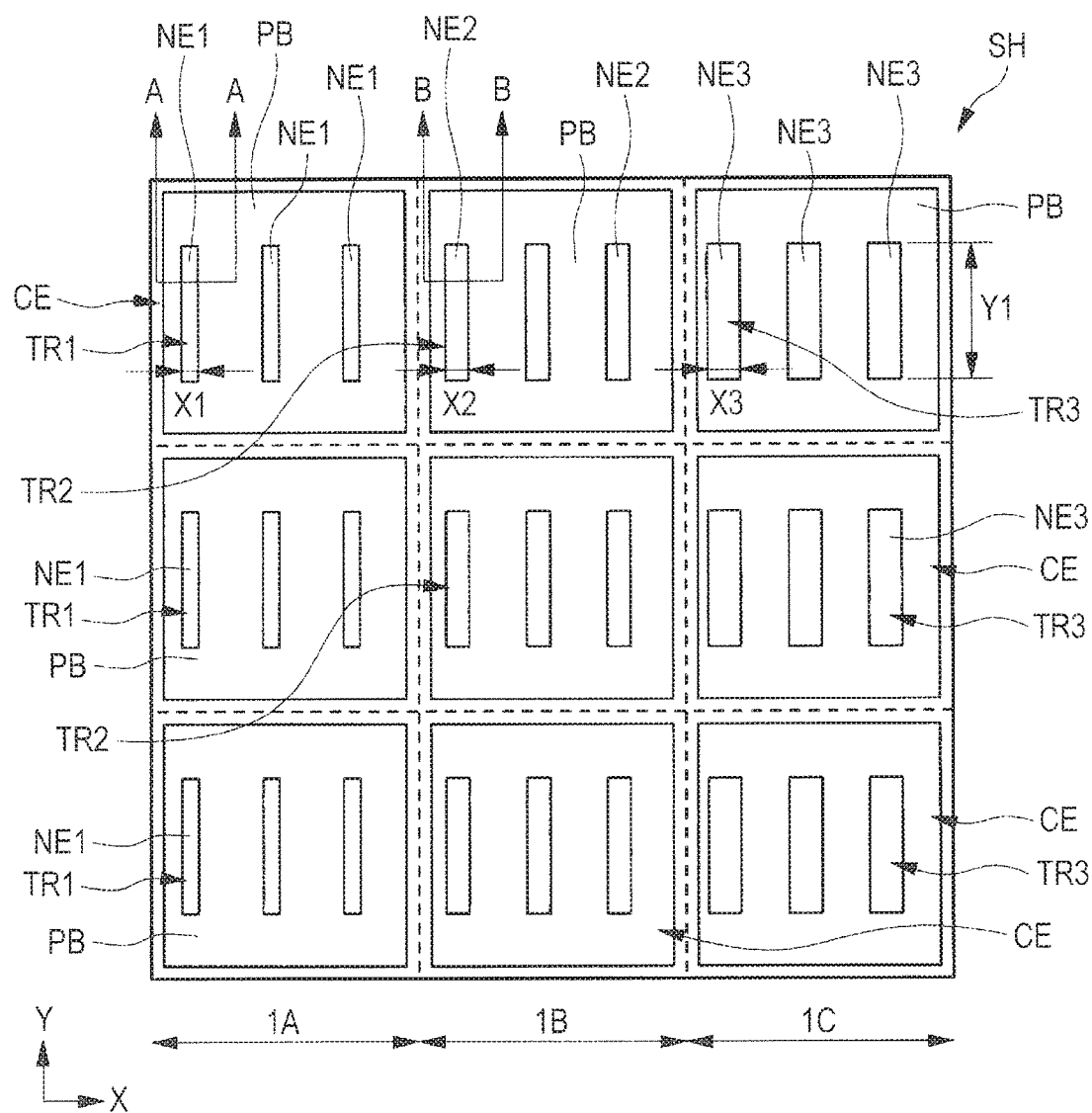
FIG. 8 is a plan view of the semiconductor device during the manufacturing process following FIG. 7.
Figure 9:
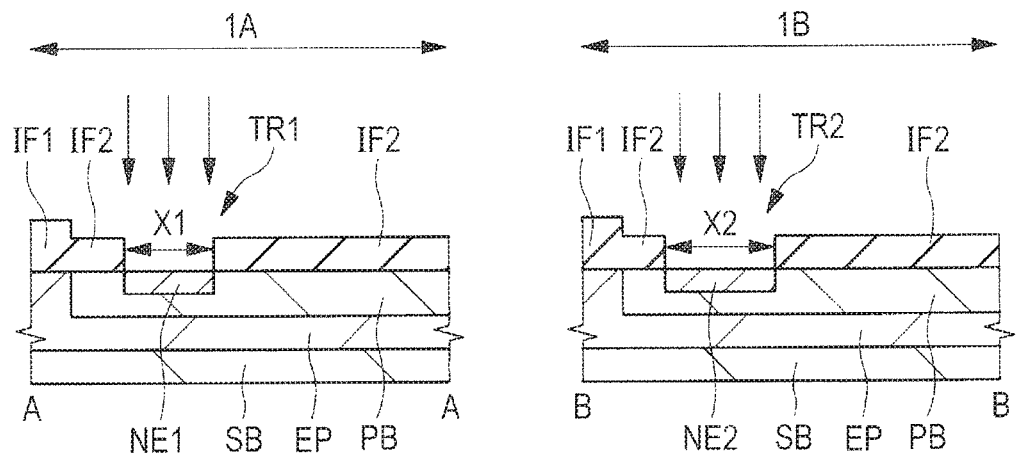
FIG. 9 includes sectional views of the semiconductor device during the manufacturing process following FIG. 7.
Figure 10:
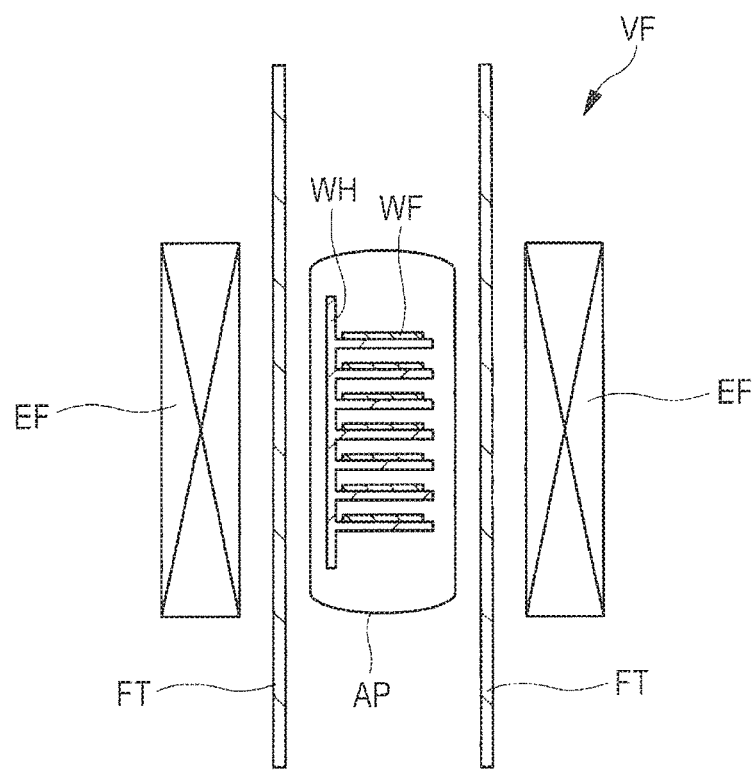
FIG. 10 is a sectional view of a vertical furnace used in the manufacturing process of the semiconductor device as the embodiment.

In each of FIGS. 3, 4, 6, 7, 9, 11, 12, and 13, a first region 1A is shown on the left side, and a second region 1B is shown on the right side. Specifically, a section along a line A-A in FIG. 2 is shown on the left side of FIG. 3, and a section along a line B-B in FIG. 2 is shown on the right side thereof. Similarly, FIG. 6 shows a section along a line A-A and a section along a line B-B in FIG. 5. FIG. 9 shows a section along a line A-A and a section along a line B-B in FIG. 8.

The first region 1A and the second region 1B are arranged along a main surface of the same semiconductor substrate (semiconductor wafer), and are regions between which different types of semiconductor chips are to be formed. Each of FIGS. 1, 2, 5, 8, and 14 does not show a film (for example, insulating film) above the semiconductor substrate.

Figure 1:
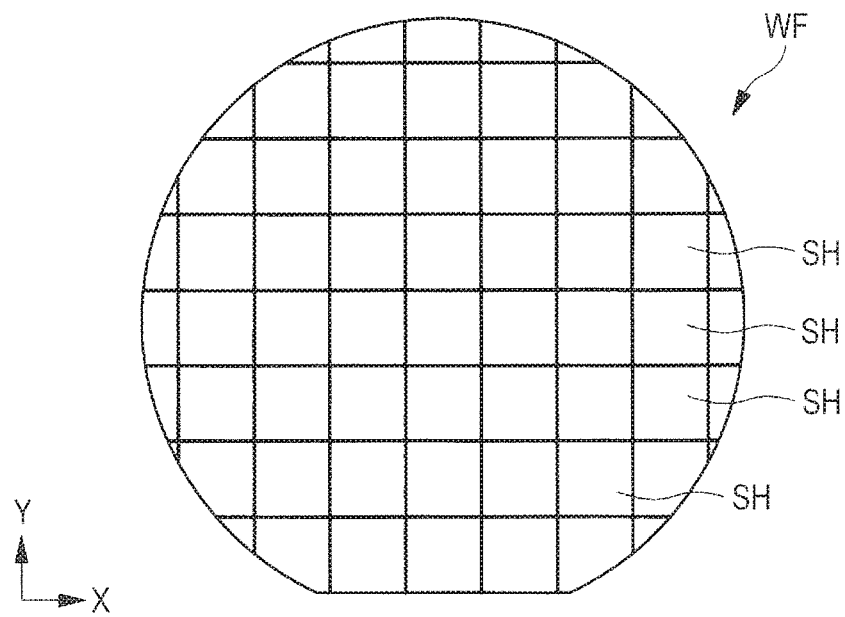
FIG. 1 is a plan view of a semiconductor device as one embodiment during a manufacturing process of the semiconductor device.
Figure 3:
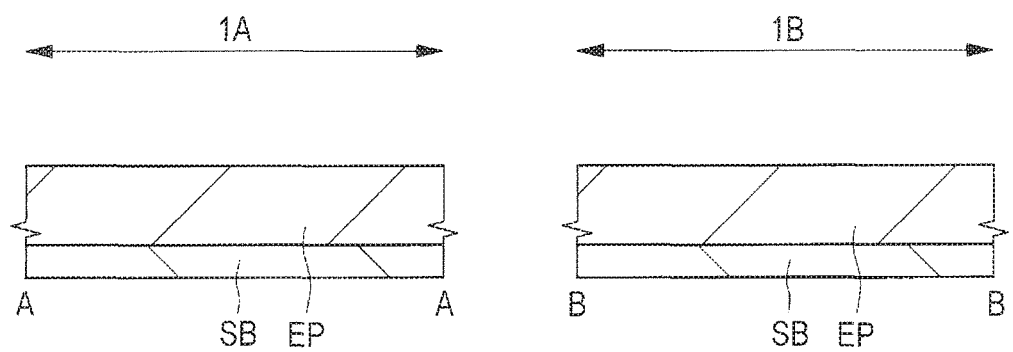
FIG. 3 includes sectional views of the semiconductor device as the embodiment during the manufacturing process.

In the manufacturing process of the semiconductor device, first, as illustrated in FIGS. 1 to 3, a semiconductor substrate SB, i.e., a semiconductor wafer WF is provided, the semiconductor substrate including n single-crystal silicon (Si) having a specific resistance of, for example, about 1 to 100 Ω·cm. Subsequently, an epitaxial layer EP is formed on the semiconductor substrate SB by an epitaxial growth process. The epitaxial layer EP is an n semiconductor layer. The semiconductor substrate SB and the epitaxial layer EP each include an n impurity (for example, arsenic (As) or phosphorous (P)). The semiconductor substrate SB has an n-impurity concentration larger than the epitaxial layer EP. The semiconductor substrate SB and the epitaxial layer EP collectively serve as a collector region of a bipolar transistor formed later.

The semiconductor wafer WF described in this application refers to a substrate including the semiconductor substrate SB and films provided above and below the semiconductor substrate SB at a time point before a dicing step as described later using FIG. 15. Specifically, the semiconductor wafer WF illustrated in FIG. 1 includes a stack including the semiconductor substrate SB and the epitaxial layer EP. In this embodiment, the stack including the semiconductor substrate SB and the epitaxial layer EP may be referred to as substrate or semiconductor substrate. Specifically, a bipolar transistor described later is a semiconductor element provided in the semiconductor substrate.

As illustrated in FIG. 1, the semiconductor wafer WF has a shape similar to a circular shape in plan view. The semiconductor wafer WF has a linear ground portion called orientation flat at part of its end in order to determine crystal orientation of the semiconductor wafer WF. The semiconductor wafer WF may have a cutout portion called notch at part of its end instead of providing the orientation flat.

Each thick straight line shown in a grid pattern on a main surface of the semiconductor wafer WF in FIG. 1 is a boundary of an exposure region SH that is exposed by one exposure step (shot) out of a plurality of times of exposure in an exposure step in the manufacturing process of the semiconductor device. In this case, the entire main surface of the semiconductor wafer WF is exposed by the plurality of times of exposure while an exposure position is shifted every exposure step. A plurality of exposure regions SH are arranged in an X direction as a direction along a main surface of the semiconductor substrate SB (see FIG. 3) and in a Y direction as a direction along the main surface of the semiconductor substrate SB and orthogonal to the X direction. Specifically, the exposure regions SH are arranged in rows and columns on the top of the semiconductor wafer WF, and each have a rectangular shape in plan view.

FIG. 2 illustrates one exposure region SH as part of the top of the semiconductor wafer WF (see FIG. 1) in an enlarged manner. A plurality of chip formation regions CE are arranged in rows and columns in the X direction (row direction) and in the Y direction (column direction) in the exposure region SH. FIG. 2 exemplarily shows a layout in which nine chip formation regions CE exist in one exposure region SH. Each of the chip formation regions CE is formed into one semiconductor chip through later steps. FIG. 2 shows a boundary between the adjoining chip formation regions CE by a broken line. Any of the exposure regions SH shown in FIG. 1 has a layout similar to that of the exposure region SH illustrated in FIG. 2. Each of FIGS. 5 and 8 used in later description also illustrates one exposure region SH as with FIG. 2.

In one exposure region SH illustrated in FIG. 2, the leftmost column is referred to as first region 1A, the middle column is referred to as second region 1B, and the rightmost column is referred to as third region 1C. Specifically, each of the first region 1A, the second region 1B, and the third region 1C includes three chip formation regions CE that are vertically arranged in a column in the exposure region SH. Since each of the exposure regions SH illustrated in FIG. 1 also has the first region 1A, the second region 1B, and the third region 1C, each of the first region 1A, the second region 1B, and the third region 1C extends from one end to the other end of the semiconductor wafer WF in the Y direction.

The first region 1A, the second region 1B, and the third region 1C are regions between which bipolar transistors having different characteristics are to be formed. Specifically, a transistor to be formed in the first region 1A has characteristics different from those in the second region 1B, a transistor to be formed in the second region 1B has characteristics different from those in the third region 1C, and a transistor to be formed in the third region 1C has characteristics different from those in the first region 1A.

FIG. 3 shows sectional views of the substrate in the first region 1A and the substrate in the second region 1B. The section of the first region 1A illustrated in FIG. 3 corresponds to a section of one chip formation region CE illustrated in FIG. 2. The section of the second region 1B illustrated in FIG. 3 corresponds to a section of another chip formation region CE illustrated in FIG. 2. In other words, the first region 1A and the second region 1B in FIG. 3 are formed into different semiconductor chips in a later step. In the following description of a manufacturing process, a manufacturing process for the first region 1A and the second region 1B is mainly described, and a manufacturing process for the third region 1C is not specifically described. However, a bipolar transistor is also formed in the third region 1C by the same process as that in each of the first region 1A and the second region 1B.

Figure 4:
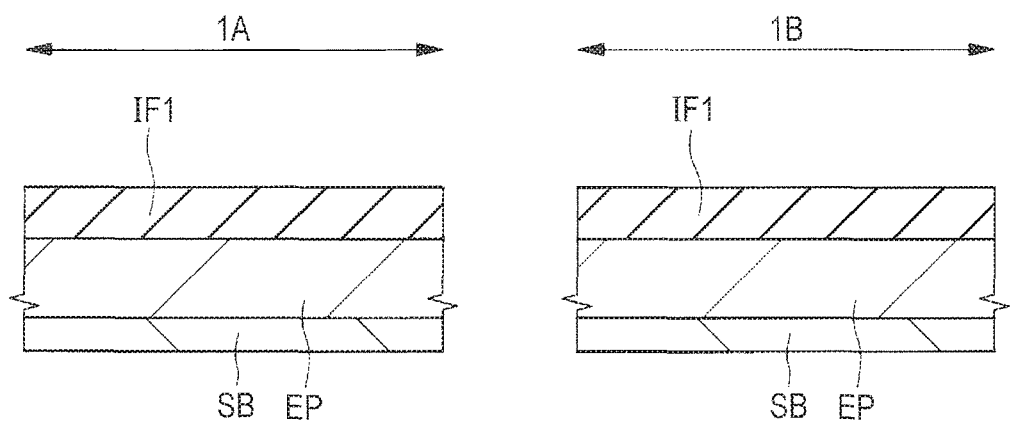
FIG. 4 includes sectional views of the semiconductor device during the manufacturing process following FIG. 3.

Subsequently, as illustrated in FIG. 4, an insulating film IF1 covering the top of the epitaxial layer EP is formed by performing heat treatment, for example. The insulating film IF1 is, for example, a thermally oxidized film, and includes a silicon oxide film.

Subsequently, as illustrated in FIGS. 5 and 6, part of the insulating film IF1 is removed using a photolithography technique and a dry etching process. The insulating film IF1 is thus patterned, thereby part of the top of the epitaxial layer EP is exposed from the insulating film IF1 in each of the first and second regions 1A and 1B. In this case, the top of the epitaxial layer EP is exposed in a central portion in plan view of each chip formation region CE (see FIG. 2). In other words, the insulating film IF1 remains annularly so as to cover the edge of the chip formation region CE.

In the photolithography technique described herein, a photoresist film (photosensitive film) is formed on the substrate by a coating process, and is exposed with, for example, ultraviolet rays through a photomask (reticule) so that a pattern is transferred, and then part of the photoresist film is removed by performing a development step, thereby an undepicted photoresist pattern is formed. Since only a pattern in a limited range can be transferred by exposure in one exposure step, the entire semiconductor wafer WF (see FIG. 1) cannot be exposed by one-time exposure. Hence, each of the exposure regions SH illustrated in FIG. 1 is subjected to exposure.

A photoresist film is applied onto the insulating film IF1. Subsequently, the photoresist film is subjected to exposure and development to remove part of the photoresist film. Consequently, part of the top of the insulating film IF1 is exposed from the photoresist film. Subsequently, a photoresist pattern including the photoresist film, which is formed through the exposure-and-development step, is used as a mask for dry etching. Consequently, the insulating film IF1 in the area exposed from the photoresist pattern is removed, thereby part of the top of the epitaxial layer EP, i.e., part of the top of the substrate is exposed. The photoresist film is removed after the dry etching step.

Subsequently, a p impurity (for example, boron (B)) is implanted into the top of the epitaxial layer EP by an ion implantation process with the insulating film IF1 as a mask. Consequently, a base region PB as a p semiconductor region is formed in a region, into which the p impurity is introduced, in the epitaxial layer EP. The base region PB is formed in the central portion in plan view in each of the chip formation regions CE in each of the first region 1A, the second region 1B, and the third region 1C. The base region PB has, for example, a rectangular shape in plan view. The base region PB is provided from the top of the epitaxial layer EP to an intermediate depth of the epitaxial layer EP. That is, the bottom of the base region PB does not reach the interface between the epitaxial layer EP and the semiconductor substrate SB.

Figure 7:
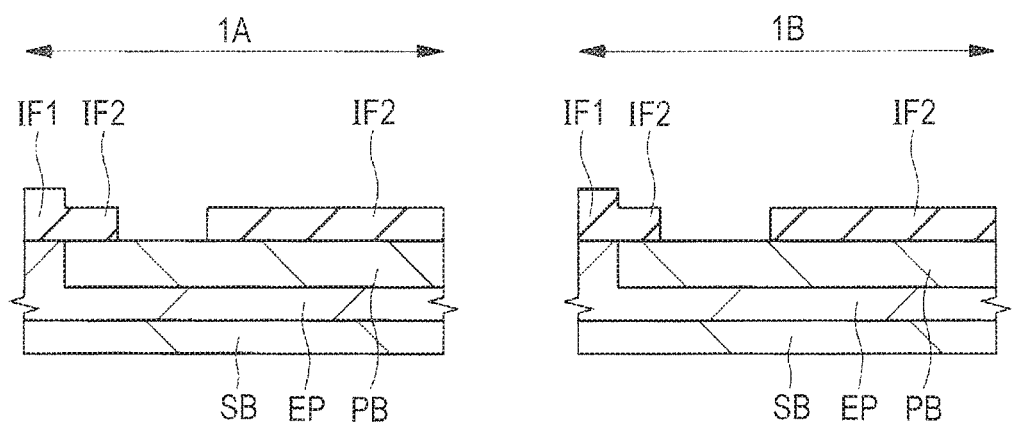
FIG. 7 includes sectional views of the semiconductor device during the manufacturing process following FIG. 5.

Subsequently, as illustrated in FIG. 7, an insulating film IF2 covering the top of the epitaxial layer EP is formed by performing heat treatment, for example. The insulating film IF2 is formed on the top of the epitaxial layer EP exposed from the insulating film IF1 in each section illustrated in FIG. 6. FIG. 7 does not show the boundary between the insulating films IF1 and IF2. The insulating film IF2 has a thickness smaller than the insulating film IF1. The insulating film IF2 is, for example, a thermally oxidized film, and includes a silicon oxide film.

Subsequently, part of the insulating film IF2 is removed using a photolithography technique and a dry etching process. The insulating film IF2 is thus patterned, thereby part of the top of the base region PB is exposed from the insulating films IF1 and IF2 in each of the first and second regions 1A and 1B. The entire region over which the insulating film IF2 is opened overlaps with the base region PB in plan view. The openings of the insulating film IF2 are formed at, for example, three points in each chip formation region CE (see FIG. 5). Each opening of the insulating film IF2 has a shape of rectangle longer in the Y direction in plan view. Width of the opening in the X direction is different between the first region 1A, the second region 1B, and the third region 1C.

Subsequently, as illustrated in FIGS. 8 and 9, an n impurity (for example, arsenic (As) or phosphorous (P)) is implanted into the top of the base region PB by an ion implantation process with the insulating films IF1 and IF2 as a mask. Consequently, emitter regions NE1, NE2, and NE3 as n semiconductor regions are formed in the respective regions, into which the n impurity is introduced, in the base regions PB.

Three emitter regions NE1 are formed side by side in the X direction on the top of the base region PB in each chip formation region CE of the first region 1A. Three emitter regions NE2 are formed side by side in the X direction on the top of the base region PB in each chip formation region CE of the second region 1B. Three emitter regions NE3 are formed side by side in the X direction on the top of the base region PB in each chip formation region CE of the third region 1C.

Each of the emitter regions NE1, NE2, and NE3 is formed from the top of the base region PB to an intermediate depth of the base region PB. That is, the bottom of each of the emitter regions NE1, NE2, and NE3 does not reach the interface between the base region PB and the epitaxial layer EP.

The shape in plan view of each of the emitter regions NE1, NE2, and NE3 is a rectangle longer in the Y direction. The emitter regions NE1, NE2, and NE3 have the same width in the Y direction. In other words, each of the emitter regions NE1, NE2, and NE3 has a length Y1 in the Y direction. The length X1 in the X direction of the emitter region NE1 is smaller than the length Y1 and smaller than the length X2 in the X direction of the emitter region NE2. The length X2 in the X direction of the emitter region NE2 is smaller than the length Y1 and smaller than the length X3 in the X direction of the emitter region NE3. The length X3 in the X direction of the emitter region NE3 is smaller than the length Y1.

Specifically, the emitter regions NE1, NE2, and NE3 having different widths in the X direction and different areas in plan view are formed on the top of the semiconductor wafer WF (see FIG. 1) and in the exposure region SH that ca be exposed by one exposure step (shot).

Subsequently, the semiconductor wafer WF is heated using a diffusion furnace (heating furnace) illustrated in FIG. 10 in order to diffuse the impurities implanted in the ion implantation steps, i.e., diffuse the impurities in the base regions and the emitter regions. The diffusion furnace VF illustrated in FIG. 10 is a vertical furnace. Specifically, the diffusion furnace VF has a cylindrical furnace core tube (quartz tube) FT extending in a direction perpendicular to a horizontal plane. The furnace core tube FT is a container that accommodates a plurality of semiconductor wafers WF to be heated. In a heating step, the semiconductor wafers WF supported by a wafer holder WH are arranged in the extending direction of the furnace core tube FT in the furnace core tube FT. At this time, the main surface of each semiconductor wafer WF is parallel to the horizontal plane.

In other words, an angle defined by the extending direction of the furnace core tube FT and the direction perpendicular to the horizontal plane is smaller than an angle defined by the extending direction of the furnace core tube FT and the horizontal plane. An angle defined by the top of a semiconductor wafer WF disposed in the furnace core tube FT and the horizontal plane is smaller than an angle defined by the top of the semiconductor wafer WF and the direction perpendicular to the horizontal plane.

The wafer holder WH and the semiconductor wafer WF are encapsulated in an ampule AP including, for example, quartz in the furnace core tube FT. The inside of the ampule AP is in a vacuum state. An annular electric furnace EF is disposed outside of the furnace core tube FT so as to surround the horizontal periphery of the ampule AP encapsulating the semiconductor wafer WF. In the step of performing the heating treatment for diffusing the impurity, the electric furnace EF is energized to produce heat so as to heat the semiconductor wafer WF in the furnace core tube FT surrounded by the electric furnace EF.

The heating step using the vertical furnace can prevent part of the semiconductor wafer WF from locally receiving stress applied when the semiconductor wafer WF is supported by the wafer holder WH. Hence, the vertical furnace allows the entire surface of the semiconductor wafer WF to be evenly heated compared with a horizontal furnace described later. Consequently, the impurity ion implanted into the semiconductor substrate SB in each of the ion implantation steps can be evenly diffused at any place in the main surface of the semiconductor wafer WF.

Through such steps, as illustrated in FIG. 9, the npn bipolar transistor TR1 having the semiconductor substrate SB and the epitaxial layer EP as the collector region, the base region PB, and the emitter region NE1 is formed in the first region 1A. Similarly, the npn bipolar transistor TR2 having the semiconductor substrate SB and the epitaxial layer EP as the collector region, the base region PB, and the emitter region NE2 is formed in the second region. Similarly, the bipolar transistor TR3 having the semiconductor substrate SB as the collector region, the emitter region NE3, and the base region PB is formed in the third region illustrated in FIG. 8.

Figure 11:
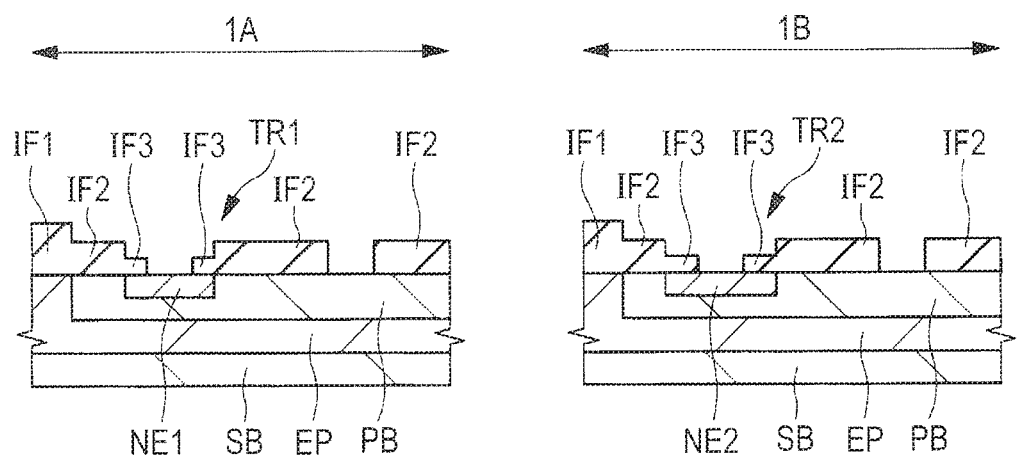
FIG. 11 includes sectional views of the semiconductor device during the manufacturing process following FIG. 9.

Subsequently, as illustrated in FIG. 11, an insulating film IF3 covering the top of the epitaxial layer EP is formed by performing heat treatment, for example. The insulating film IF3 is formed on the top of the epitaxial layer EP exposed from the insulating films IF1 and IF2 in the section illustrated in FIG. 9. FIG. 11 does not show the boundary between the insulating films IF1 and IF2 and the boundary between the insulating films IF2 and IF3. The insulating film IF3 has a thickness smaller than the insulating film IF2. The insulating film IF3 is, for example, a thermally oxidized film, and includes a silicon oxide film.

Subsequently, part of each of the insulating films IF2 and IF3 is removed using a photolithography technique and a dry etching process. The insulating films IF2 and IF3 are thus patterned, thereby part of each of the tops of the emitter region NE1, the emitter region NE2, and the base region PB is exposed from the insulating films IF2 and IF3.

In planar view, the entire region, over which the insulating film IF3 is opened, is located inside of the opening formed in the insulating film IF2 in the patterning step described with FIG. 7. Hence, only the top of the emitter region NE1 is exposed on the bottom of the opening of the insulating film IF3 in the first region 1A, and only the top of the emitter region NE2 is exposed on the bottom of the opening of the insulating film IF3 in the second region 1B. The opening of the insulating film IF3 is formed in each opening of the insulating film IF2. Three openings of the insulating film IF3 are therefore formed side by side in the X direction in plan view in each of the first region 1A to the third region 1C.

Only the top of the base region PB is exposed on the bottom of the opening penetrating through the insulating film IF2, the opening being formed in each of the first region 1A and the second region 1B in the patterning step. The opening of the insulating film IF2 is disposed alongside of the opening of the insulating film IF3 in the X-axis direction in the vicinity of each opening penetrating through the insulating film IF3. Specifically, some of the openings of the insulating film IF2 are each formed between the openings of the insulating film IF3 arranged in the X direction in each of the first region 1A to the third region 1C (see FIG. 8).

Figure 12:
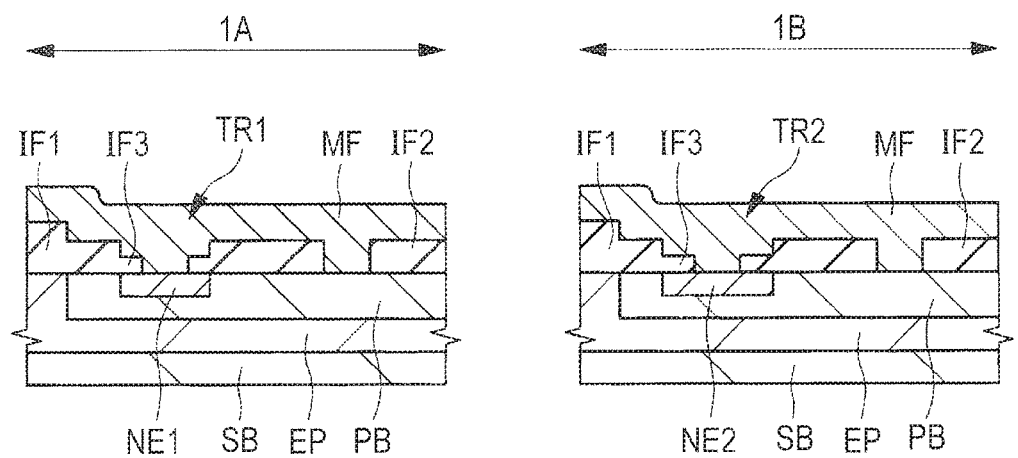
FIG. 12 includes sectional views of the semiconductor device during the manufacturing process following FIG. 11.

Subsequently, as illustrated in FIG. 12, a metal film MF is formed on the semiconductor substrate SB by a sputtering process, for example. The metal film MF includes an aluminum (Al) film, for example.

Figure 13:
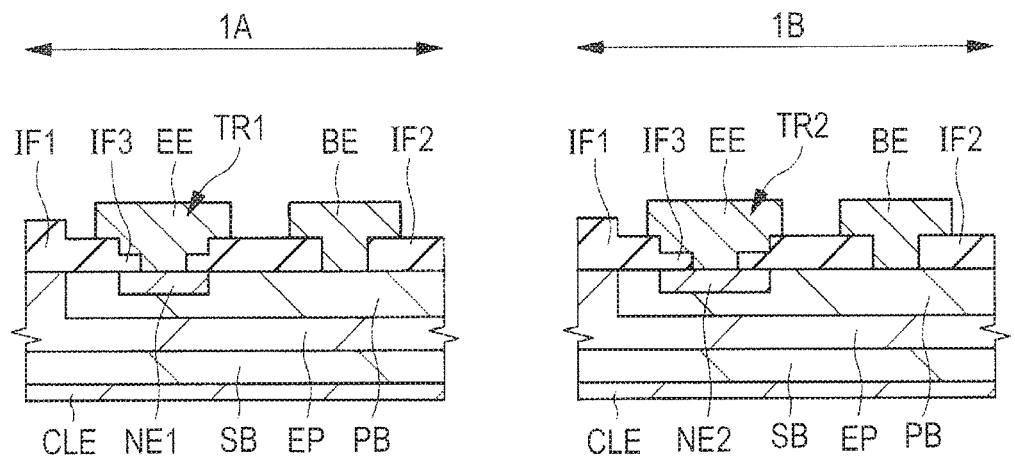
FIG. 13 includes sectional views of the semiconductor device during the manufacturing process following FIG. 12.

Subsequently, as illustrated in FIG. 13, part of the metal film MF is removed using a photolithography technique and a dry etching process. The metal film MF is thus patterned, thereby an emitter electrode EE and a base electrode BE, which each include the metal film MF, are formed on the semiconductor substrate SB in each of the first region 1A and the second region 1B. The emitter electrode EE in the first region 1A is coupled to the top of the emitter region NE1 on the bottom of the opening of the insulating film IF3. The emitter electrode EE in the second region 1B is coupled to the top of the emitter region NE2 on the bottom of the opening of the insulating film IF3. The base electrode BE in the first region 1A is formed next to the emitter electrode EE, and is coupled to the top of the base region PB on the bottom of the opening of the insulating film IF2. The base electrode BE in the second region 1B is formed next to the emitter electrode EE, and is coupled to the top of the base region PB on the bottom of the opening of the insulating film IF2.

Subsequently, a collector electrode CLE is formed, which is coupled to the back on a side opposite to the main surface of the semiconductor substrate SB while covering the back. The collector electrode CLE can be formed by a sputtering process, for example. The collector electrode CLE has a stacked structure including, for example, a titanium (Ti) film and a gold (Au) film stacked in this order from the back side. The emitter electrode EE is electrically coupled to the emitter region NE1 in the first region 1A. The emitter electrode EE is electrically coupled to the emitter region NE2 in the second region 1B. The base electrode BE is electrically coupled to the base region PB, and the collector electrode CLE is electrically coupled to the semiconductor substrate SB as the collector region in each of the first region 1A and the second region 1B.

Figure 14:
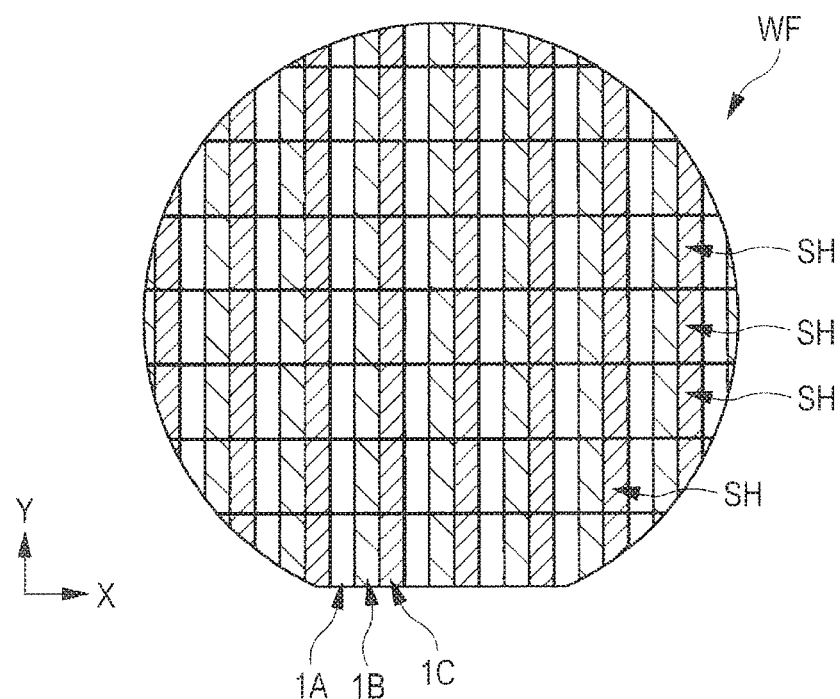
FIG. 14 is a plan view of the semiconductor device during the manufacturing process following FIG. 12.

FIG. 14 distinctively illustrates the first region 1A, the second region 1B, and the third region 1C on the main surface of the semiconductor wafer WF. In FIG. 14, the second region 1B and the third region 1C are differently hatched, while the first region 1A is not hatched. Each exposure region SH partitioned by a thick line in FIG. 14 has the first region 1A, the second region 1B, and the third region 1C arranged in the X direction. FIG. 14 does not illustrate individual chip formation regions CE (see FIG. 8).

As illustrated in FIG. 8, in the first region 1A, a plurality of chip formation regions CE, each including three bipolar transistors TR1, are arranged in the Y-axis direction. In the second region 1B, a plurality of chip formation regions CE, each including three bipolar transistors TR2, are arranged in the Y-axis direction. In the third region 1C, a plurality of chip formation regions CE, each including three bipolar transistors TR3, are arranged in the Y-axis direction. FIG. 14 shows a position of the first region 1A having the bipolar transistors TR1 (see FIG. 8), a position of the second region 1B having the bipolar transistors TR2 (see FIG. 8), and a position of the third region 1C having the bipolar transistors TR3 (see FIG. 8).

Figure 15:
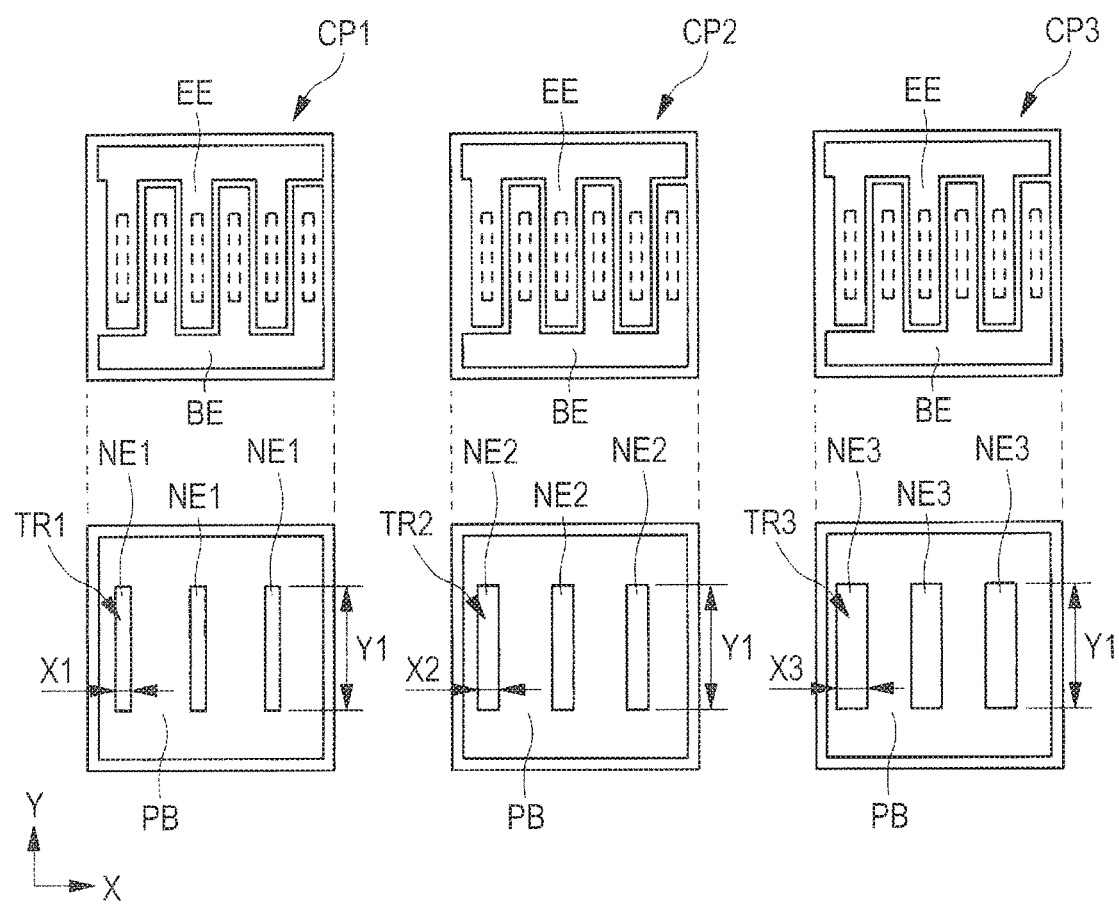
FIG. 15 includes plan views of the semiconductor device during the manufacturing process following FIG. 13.

Subsequently, as illustrated in FIG. 15, a plurality of semiconductor chips are produced by performing a dicing step. Specifically, the semiconductor wafer WF is cut using a dicing blade along scribe lines shown by a broken line and a thick line in FIG. 8, and thus the semiconductor wafer WF (see FIG. 14) is divided into individual chips. The semiconductor devices of this embodiment, i.e., a plurality of semiconductor chips CP1, a plurality of semiconductor chips CP2, and a plurality of semiconductor chips CP3, can be provided through this step.

FIG. 15 shows plan views of the semiconductor chips each including the emitter electrode EE and the base electrode BE on the upper side of the drawing, and shows plan views of the semiconductor chips while omitting the emitter electrode EE, the base electrode BE, and the insulating film. Each plan view on the upper side of FIG. 15 shows a contour of a portion at which each electrode is coupled to the semiconductor substrate.

The semiconductor chip CP1 is produced from the chip formation region CE (see FIG. 8) of the first region 1A (see FIGS. 13 and 14) through the dicing step, and includes the bipolar transistors TR1 formed in the semiconductor substrate SB. The semiconductor chip CP2 is produced from the chip formation region CE of the second region 1B (see FIGS. 13 and 14) through the dicing step, and includes the bipolar transistors TR2 formed in the semiconductor substrate SB. The semiconductor chip CP3 is produced from the chip formation region CE of the third region 1C (see FIG. 14) through the dicing step, and includes the bipolar transistors TR3 formed in the semiconductor substrate SB.

The semiconductor chip CP1 does not include the bipolar transistors TR2 and TR3, the semiconductor chip CP2 does not include the bipolar transistors TR1 and TR3, and the semiconductor chip CP3 does not include the bipolar transistors TR1 and TR2.

As illustrated in FIG. 15, each of the emitter electrode EE and the base electrode BE has a comb shape in plan view. Specifically, each of the emitter electrode EE and the base electrode BE has a portion extending in the X direction in the vicinity of one end in the Y direction of each chip, and a plurality of extensions extending in the Y direction from that portion toward the other end in the Y direction of that chip. The extensions are disposed side by side in the X direction. The extensions extending in the Y direction of the emitter electrode EE and the extensions extending in the Y direction of the base electrode BE are alternately disposed side by side in the X direction.

The extensions extending in the Y direction of the emitter electrode EE are each coupled to the emitter region NE1, NE2, or NE3 on the main surface of the semiconductor substrate SB directly below the extensions. Similarly, the extensions extending in the Y direction of the base electrode BE are each coupled to the base region PB on the main surface of the semiconductor substrate SB directly below the extensions.

Three emitter regions NE1 are disposed side by side in the X direction on the main surface of the semiconductor substrate SB of the semiconductor chip CP1. Three emitter regions NE2 are disposed side by side in the X direction on the main surface of the semiconductor substrate SB of the semiconductor chip CP2. Three emitter regions NE3 are disposed side by side in the X direction on the main surface of the semiconductor substrate SB of the semiconductor chip CP3.

FIG. 15 shows signs TR1 to TR3 assuming that the bipolar transistors TR1 to TR3 are provided in respective portions of the semiconductor substrate SB, the portions overlapping with the regions, in which the emitter regions NE1, NE2, and NE3 are formed, in plan view. In a possible case, however, one bipolar transistor is provided for each of the semiconductor chips. The three emitter regions in one semiconductor chip are electrically coupled to one another by the emitter electrode.

The emitter region NE1 configuring the bipolar transistor TR1 of the semiconductor chip CP1, the emitter region NE2 configuring the bipolar transistor TR2 of the semiconductor chip CP2, and the emitter region NE3 configuring the bipolar transistor TR3 of the semiconductor chip CP3 have different shapes in plan view. The emitter regions NE1, NE2, and NE3, each having a rectangular shape in plan view, have the same width in the Y direction, but have different widths in the X direction.

In other words, the length X1 of the emitter region NE1 is smaller than the length X2 of the emitter region NE2, and the length X2 is smaller than the length X3 of the emitter region NE3 in the X direction. Hence, area of the emitter region NE1 is smaller than area of the emitter region NE2, and the area of the emitter region NE2 is smaller than area of the emitter region NE3 in plan view.

An amplification factor (gain) $h_{FE}$ of a bipolar transistor characteristically varies depending on area of an emitter region of the bipolar transistor. The amplification factor (gain) $h_{FE}$ described in this application refers to direct-current amplification factor (direct-current gain) of a transistor, for example.

Figure 16:
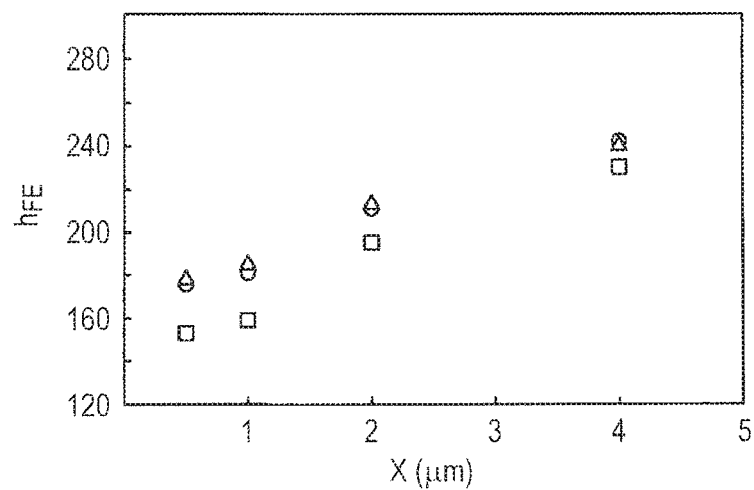
FIG. 16 is a graph showing a relationship between size of an emitter region and amplification factor characteristics.

FIG. 16 shows a graph showing a relationship between the width of the emitter region and the amplification factor $h_{FE}$. The horizontal axis of FIG. 16 indicates width in the X direction of the emitter region, and the vertical axis thereof indicates the amplification factor $h_{FE}$. FIG. 16 shows measurement results of values of amplification factors $h_{FE}$ of respective bipolar transistors of semiconductor chips produced from three semiconductor wafers. The square plots, circular plots, and triangular plots in FIG. 16 indicate measurement values for the semiconductor chips produced from the separate semiconductor wafers. The bipolar transistors used for the measurement have the same width in the Y direction. Consequently, area of the emitter region varies directly with the width in the X direction.

As illustrated in FIG. 16, for example, the length X as emitter opening size is varied from 0.1 to 4 μm, thereby the amplification factor $h_{FE}$ increases about 1.5 times. In this way, as the width in the X direction of the emitter region increases, the value of the amplification factor $h_{FE}$ of the bipolar transistor increases. In other words, as the area of the emitter region increases, the amplification factor $h_{FE}$ of the bipolar transistor increases. This is because an area ratio of the base to the emitter, which determines the amplification factor characteristics, is varied by varying the area of the emitter region. In this way, area of the emitter region is varied, thereby the amplification factor $h_{FE}$ of the bipolar transistor can be controlled to any value.

Effects of Embodiment

Figure 18:
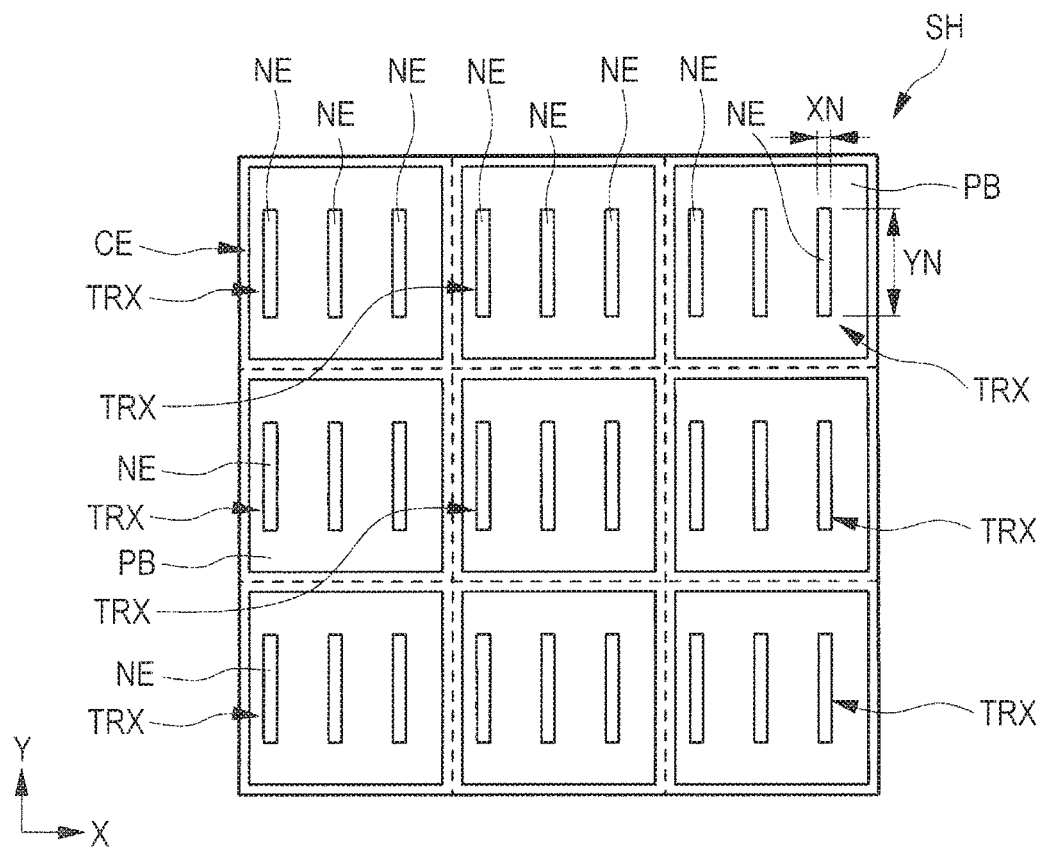
FIG. 18 is a plan view of a semiconductor device as a comparative example during a manufacturing process of the semiconductor device.
Figure 19:
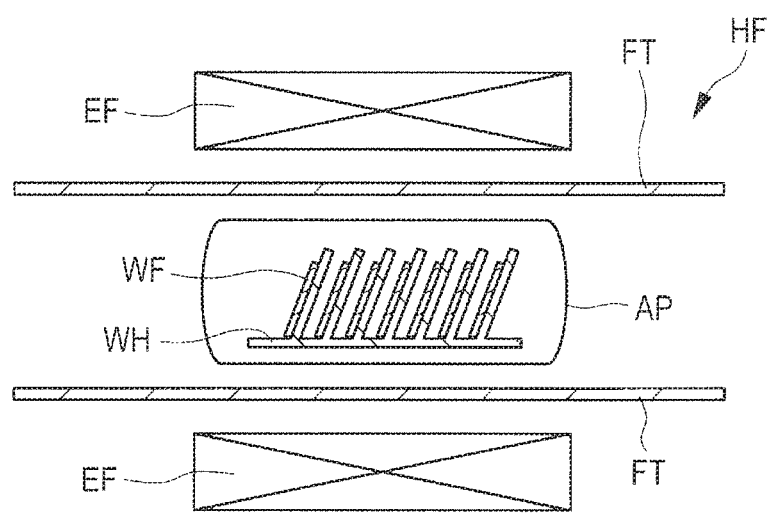
FIG. 19 is a sectional view of a horizontal furnace used in a manufacturing process of a semiconductor device as a comparative example.

The effects of the manufacturing method of this embodiment are now described with FIGS. 18 and 19 illustrating a comparative example. FIG. 18 is a plan view illustrating a manufacturing process of a semiconductor device of a comparative example. FIG. 19 is a sectional view of a horizontal furnace usable in a manufacturing process of a semiconductor device of another comparative example.

FIG. 18 is a plan view illustrating an exposure region at a point after a bipolar transistor has been formed in a semiconductor substrate and before a dicing step is performed. Specifically, FIG. 18 illustrates an exposure region SH as a range that can be exposed by one exposure step (shot) as with FIG. 8. Chip formation regions CE in the exposure region SH have the same planar layout. Specifically, emitter regions NE of bipolar transistors TRX provided in all the chip formation regions CE have the same length XN in the X direction and the same length YN in the Y direction.

Hence, the emitter regions NE of the bipolar transistors TRX in all the chip formation region CE have the same area. In this comparative example, therefore, a plurality of semiconductor chips that can be produced from a semiconductor wafer have transistors having the same amplification factor characteristics.

A diffusion furnace HF illustrated in FIG. 19 is probably used in a heat treatment step that is performed to diffuse impurities introduced into the base region PB and the emitter region NE on the top of the semiconductor substrate illustrated in FIG. 18. The diffusion furnace HF has a cylindrical furnace core tube (quartz tube) FT extending in a horizontal direction. In other words, the diffusion furnace HF is a horizontal furnace. In a heating step, a plurality of semiconductor wafers WF supported by a wafer holder WH in the furnace core tube FT are arranged in an extending direction of the furnace core tube FT. Each of the semiconductor wafers WF is supported by the wafer holder WH such that the main surface of the semiconductor wafer has an angle close to a right angle with respect to a horizontal plane.

The wafer holder WH and the semiconductor wafer WF are encapsulated in an ampule AP including, for example, quartz in the furnace core tube FT. The inside of the ampule AP is in a vacuum state. An annular electric furnace EF is disposed outside of the furnace core tube FT. For heating, the electric furnace EF is allowed to produce heat so as to heat the semiconductor wafer WF.

In the manufacturing process for forming the bipolar transistor TRX of the comparative example illustrated in FIG. 18, however, the vertical diffusion furnace VF illustrated in FIG. 10 is used in the heat treatment step for impurity diffusion. If the horizontal diffusion furnace HF illustrated in FIG. 19 is used, it is difficult to evenly heat the entire surface of the semiconductor wafer WF due to, for example, force applied to a portion at which the semiconductor wafer WF is in contact with the wafer holder WH. In such a case, a level of impurity diffusion varies between the chip formation regions of the semiconductor wafer WF, resulting in variations in characteristics of semiconductor chips produced from the semiconductor wafer WF, i.e., variations in amplification factors $h_{FE}$.

In contrast, the vertical diffusion furnace VF illustrated in FIG. 10 can heat the entire surface of the semiconductor wafer WF more uniformly, making it possible to evenly diffuse impurities in the entire semiconductor wafer WF. This prevents product failure, and makes it possible to produce a large number of semiconductor chips including bipolar transistors having a desired amplification factor $h_{FE}$ from one semiconductor wafer WF.

A large number of semiconductor chips including transistors having the same amplification factor $h_{FE}$ can be exclusively manufactured from one semiconductor wafer including the exposure regions SH of the comparative example illustrated in FIG. 18. In other words, only semiconductor chips having one amplification factor characteristics are produced from one semiconductor wafer of the comparative example. In manufacturing of semiconductor chips having transistors, a plurality of types of semiconductor chips with transistors having different amplification factors $h_{FE}$ may be required to be manufactured such that a required number of semiconductor chips are manufactured for each of the amplification factors $h_{FE}$ depending on a required specification.

For example, a desired number of first semiconductor chips including transistors having a first amplification factor and a desired number of second semiconductor chips including transistors having a second amplification factor different from the first amplification factor may be required to be manufactured. In such a case, as in the comparative example illustrated in FIG. 18, if the chip formation regions CE in the semiconductor wafer are formed with the same layout, and if only the first semiconductor chips including the bipolar transistors TRX having the same first amplification factor are thus manufactured from the semiconductor wafer, a large number of first semiconductor chips, the number being larger than the desired number, are produced from the semiconductor wafer. Unnecessary first semiconductor chips are manufactured in this way. Hence, when the manufacturing method of the semiconductor device of the comparative example, which accompanies production of unnecessary semiconductor chips, is used, manufacturing cost of the semiconductor device disadvantageously increases.

In particular, when a small number of semiconductor chips having predetermined characteristics are desired to be produced from one semiconductor wafer WF, an excessively large number of semiconductor chips having such characteristics are produced from the semiconductor wafer WF. As a result, a large number of unnecessary semiconductor chips are manufactured, and the above-described disadvantage becomes notable. If the semiconductor wafer has a large diameter, a large number of unnecessary semiconductor chips are manufactured from one semiconductor wafer WF, and thus the above-described disadvantage becomes notable.

When the diffusion treatment is performed using the vertical diffusion furnace VF illustrated in FIG. 10, semiconductor chips are manufactured from a semiconductor wafer while characteristics of the chips are uniformed compared with a case of using the horizontal diffusion furnace HF illustrated in FIG. 19. Hence, if a desired number of semiconductor chips having predetermined characteristics are produced, an increased number of unnecessary semiconductor chips having such characteristics are also produced. Consequently, the disadvantage of an increase in manufacturing cost becomes notable.

A technique for controlling the amplification factor characteristics in the manufacturing process probably includes a technique of varying impurity concentration in the base region or the emitter region, a technique of varying temperature of heat treatment for impurity diffusion in the base region or the emitter region, and a technique of varying temperature of oxidation treatment. Each of such manufacturing conditions can be varied only in wafers. It is therefore difficult to form various semiconductor chips manufactured under such different conditions from one semiconductor wafer. In other words, it is difficult to manufacture various semiconductor chips having different amplification factor characteristics from one semiconductor wafer by such a technique of varying the manufacturing condition.

In contrast, in the semiconductor device of this embodiment, as described with FIGS. 7 and 8, emitter regions are formed in different chip formation regions of a semiconductor wafer in the emitter region formation step while having areas that are not the same but are different between all the chip formation regions. In other words, bipolar transistors having emitter regions having different areas are formed in different chip formation regions within an exposure region as an area that can be exposed by one exposure step.

Consequently, a plurality of types of semiconductor chips having different amplification factor characteristics can be produced from one semiconductor wafer. In this embodiment, as illustrated in FIG. 8, the three types of emitter regions NE1, NE2, and NE3 having different areas are formed in the first region 1A, the second region 1B, and the third region 1C, respectively. Hence, three types of semiconductor chips including bipolar transistors having different amplification factor characteristics can be produced from one semiconductor wafer.

Consequently, for example, a first semiconductor chip including a transistor having a first amplification factor, a second semiconductor chip including a transistor having a second amplification factor different from the first amplification factor, and a third semiconductor chip including a transistor having a third amplification factor different from each of the first and second amplification factors can be produced from one semiconductor wafer. Consequently, for example, even if a small number of first semiconductor chips are required, a decreased number of excessive first semiconductor chips are manufactured from the semiconductor wafer, and the second semiconductor chips and the third semiconductor chips are not uselessly manufactured from the semiconductor wafer. This means a reduction in loss due to excess production.

In addition, when semiconductor chips having several types of amplification factor characteristics are manufactured, a particular number of semiconductor wafers are not necessary to be used, the number being equal to the number of the types. It is therefore possible to decrease the number of semiconductor wafers to be used for manufacturing. In addition, it is possible to decrease the number of steps for manufacturing the semiconductor device. For example, when the semiconductor chips having several types of amplification factor characteristics are manufactured, diffusion treatment is probably performed for each of the types of amplification factor characteristics to form transistors having different amplification factor characteristics. In this embodiment, however, the transistors having different amplification factor characteristics can be formed by one-time diffusion treatment.

In this way, using the method of manufacturing the semiconductor device of this embodiment can improve productivity of the semiconductor device, allowing manufacturing cost of the semiconductor device to be reduced.

This embodiment is particularly effective in the case where a large number of semiconductor chips can be manufactured from one semiconductor wafer, for example, in the case where a semiconductor wafer used in the manufacturing process has a diameter larger than six inches. For example, the number of producible semiconductor chips is two times larger in the case of using a semiconductor wafer having a diameter of eight inches than in the case of using a semiconductor wafer having a diameter of six inches.

This embodiment is particularly effective in the case of performing the diffusion treatment with a vertical furnace. Using the vertical furnace instead of the horizontal furnace makes it possible to accurately control the amplification factor characteristics of transistors in the entire semiconductor wafer. This can prevent excess manufacturing of useless semiconductor chips having predetermined amplification factor characteristics in the case of using the vertical furnace.

Modification

A case where bipolar transistors, which have increased types of amplification factor characteristics, are formed in an exposure region that can be exposed by one exposure step is now described as a modification of this embodiment.

Figure 17:
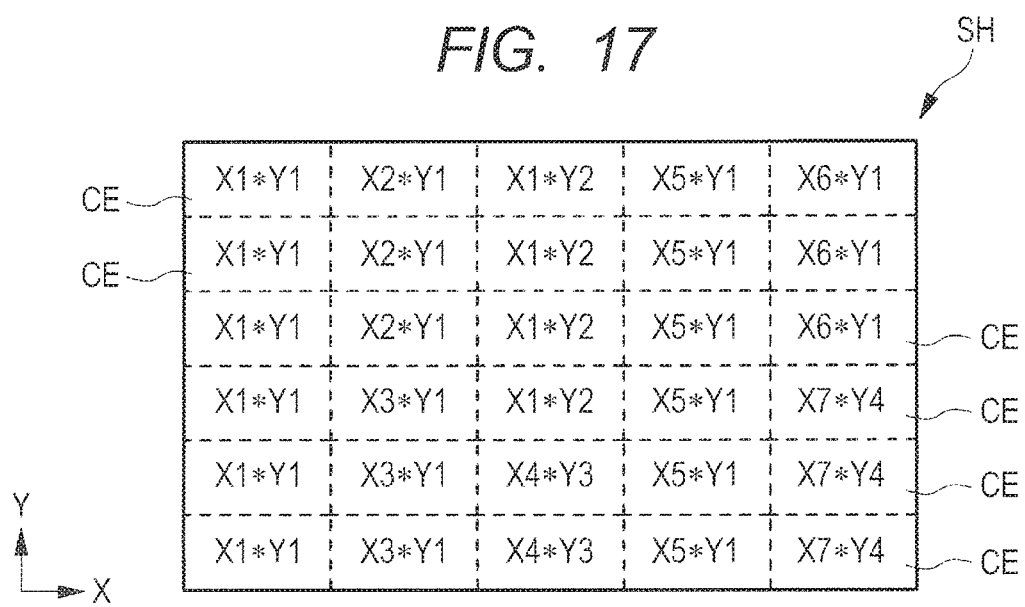
FIG. 17 is a plan view of a semiconductor device as a modification of the embodiment during a manufacturing process of the semiconductor device.

FIG. 17 is a plan view illustrating manufacturing process of a semiconductor device of this modification. FIG. 17 illustrates an exposure region SH that can be exposed by one exposure step. In this modification, unlike the layout described with FIG. 8, 30 chip formation regions CE in total are disposed in rows and columns in the exposure region SH. Six rows of chip formation regions CE exist in the Y direction while five columns of chip formation regions CE exist in the X direction in the exposure region SH.

In the manufacturing method described with FIG. 8, the bipolar transistor TR1 having the first amplification factor characteristics is formed in the first region 1A, the bipolar transistor TR2 having the second amplification factor characteristics is formed in the second region 1B, and the bipolar transistor TR3 having the third amplification factor characteristics is formed in the third region 1C in the exposure region SH. This makes it possible to produce three types of semiconductor chips including bipolar transistors having different amplification factors from one semiconductor wafer.

On the other hand, the types of bipolar transistors formed in the exposure region SH may be increased as in this modification. In FIG. 17, each chip formation region CE shows size of the emitter region formed therein. Specifically, each chip formation region CE shows a combination of size in the X direction and size in the Y direction of the emitter region having a rectangular shape in plan view. FIG. 17 exemplarily illustrates eight patterns of X1×Y1, X2×Y1, X3×Y1, X1×Y2, X4×Y3, X5×Y1, X6×Y1, and X7×Y4 as types of size of the emitter regions to be formed in one exposure region SH.

FIG. 8 shows a case where transistors having the same amplification factor characteristics are formed in any of the chip formation regions CE arranged in the Y direction in the exposure region SH. However, the chip formation regions CE arranged in the Y direction are not necessary to have transistors having the same amplification factor characteristics therebetween.

The semiconductor chips provided in the exposure region have increased types of amplification factor characteristics as in this modification, making it possible to more effectively prevent excess production of semiconductor chips having predetermined amplification factor characteristics. In addition, since semiconductor chips having increased types of characteristics can be produced from one semiconductor wafer, when many types (specifications) of semiconductor chips are desired to be produced, a decreased number of semiconductor wafers can be used, leading to a decrease in the number of steps for manufacturing the semiconductor device.

Although the invention achieved by the inventors has been described in detail according to one embodiment thereof hereinbefore, the invention should not be limited thereto, and it will be appreciated that various modifications or alterations thereof may be made within the scope without departing from the gist of the invention.

What is claimed is:

1. A method of manufacturing a semiconductor device, comprising the steps of:
(a) providing a semiconductor substrate having a first conductivity type;
(b) forming a first semiconductor region having a second conductivity type different from the first conductivity type over a top of the semiconductor substrate;
(c) forming a second semiconductor region having the first conductivity type and a third semiconductor region having the first conductivity type over a top of the first semiconductor region; and
(d) dividing the semiconductor substrate into individual pieces, thereby forming a first semiconductor chip including a first transistor including the semiconductor substrate, the first semiconductor region, and the second semiconductor region, and a second semiconductor chip including a second transistor including the semiconductor substrate, the first semiconductor region, and the third semiconductor region;
wherein area of the second semiconductor region is smaller than area of the third semiconductor region in plan view.

2. The method according to claim 1, wherein in the step (c), an impurity having the first conductivity type is introduced into the top of the semiconductor substrate, thereby the second semiconductor region and the third semiconductor region are formed, and
wherein the method further comprises the step of:
(d1) after the step (c), heating the semiconductor substrate with a vertical furnace.

3. The method according to claim 1, wherein an amplification factor of the first transistor is smaller than an amplification factor of the second transistor.

4. The method according to claim 1, wherein the step (c) further comprises the steps of:
(c1) forming an insulating film covering the top of the semiconductor substrate;
(c2) forming a photosensitive film over the insulating film;
(c3) performing exposure and development of the photosensitive film, thereby removing part of the photosensitive film to expose a top of the insulating film;
(c4) after the step (c3), processing the insulating film with the photosensitive film as a mask, thereby exposing the top of the semiconductor substrate; and
(c5) implanting an impurity having the first conductivity type into the top of the semiconductor substrate, thereby forming the second semiconductor region and the third semiconductor region,
wherein in the step (c5), the second semiconductor region and the third semiconductor region are formed in a region that can be exposed by one-time exposure performed in the step (c3).

5. The method according to claim 1, wherein in the step (d), a plurality of semiconductor chips each being the first semiconductor chip and a plurality of semiconductor chips each being the second semiconductor chip are formed.

6. The method according to claim 1, wherein a semiconductor wafer including the semiconductor substrate has a diameter larger than six inches.

7. The method according to claim 2,
wherein the vertical furnace has a furnace core tube that extends in a direction perpendicular to a horizontal plane, and
wherein in the step (d1), the semiconductor substrate is heated, the semiconductor substrate being disposed in the furnace core tube while a top of the semiconductor substrate is parallel to the horizontal plane.

8. The method according to claim 1,
wherein depth of the first semiconductor region is deeper than depth of each of the second semiconductor region and the third semiconductor region, and
wherein each of the first transistor and the second transistor is a bipolar transistor.

9. The method according to claim 1, wherein the first semiconductor chip does not include the second transistor, and the second semiconductor chip does not include the first transistor.

10. The method according to claim 1, wherein the second semiconductor region is a first emitter region of the first transistor, and the third semiconductor region is a second emitter region of the second transistor.

11. The method according to claim 2, wherein in the step (d1), the semiconductor substrate is heated, thereby the impurity having the first conductivity type is diffused.

* * * * *